United States Patent [19]

Delaney et al.

[11] Patent Number: 4,902,363
[45] Date of Patent: Feb. 20, 1990

[54] METHOD USING COMPRESSIBLE TEMPORARY SUPPORT FOR TRANSFER LAYER

[75] Inventors: William E. Delaney, Hockessin, Del.; Helmut H. Frohlich, Heusenstamm, Fed. Rep. of Germany

[73] Assignee: E. I. Du Pont de Nemours and Company, Wilmington, Del.

[21] Appl. No.: 176,438

[22] Filed: Feb. 25, 1988

[30] Foreign Application Priority Data

Feb. 28, 1987 [DE] Fed. Rep. of Germany ....... 3706528

[51] Int. Cl.[4] ................................................ B44C 1/24
[52] U.S. Cl. ..................................... 156/230; 156/234; 430/271; 430/252; 430/259
[58] Field of Search ....................... 430/252, 259, 271; 156/230, 234

[56] References Cited

U.S. PATENT DOCUMENTS 4,684,600 8/1987 Worns et al. ......................... 430/271

Primary Examiner—J. David Welsh

[57] ABSTRACT

The invention relates to transfer layer sheets comprising a transfer layer on a compressible temporary support, and processes for their use.

8 Claims, No Drawings

METHOD USING COMPRESSIBLE TEMPORARY SUPPORT FOR TRANSFER LAYER

BACKGROUND OF THE INVENTION

The subject of this invention is temporary supports or carrier layers for transfer layers.

Transfer layer sheets and processes are well known and have multiple applications in the electronics industry, for example, for making photoresist masks and solder resist masks and similarly, in the printing industry for making color reproductions and for proofing color separations.

These transfer layer sheets comprise a temporary support, the transfer layer that is carried thereon and, optionally, an intermediate layer.

Synthetic resin films of polyesters, polyamides, polyethylene, polypropylene, polyvinyl chloride and similar materials are used as temporary supports.

The appropriate transfer layer can be light sensitive as well as light insensitive.

Light sensitive transfer layers contain, as significant components, a binder, a light sensitive compound, the solubility of which changes after exposure to light, and a photoinitiator or photoinitiator system. For making color reproductions, the layers can also be colored with an appropriate dyestuff.

Furthermore, light insensitive transfer layers are also known for use in recording on light sensitive layers which contain imagewise tacky and nontacky areas. These transfer layers contain at least one binder and a finely divided powder suitable for production of the image.

In the transfer process, either the entire transfer layer or imagewise areas are transferred from the temporary support onto the permanent support using pressure and/or heat. After the transfer, the temporary support is stripped from the transfer layer. Achieving good results requires that the transfer layer have greater adhesion to the permanent support than to the temporary support.

A common problem of such transfer processes is that the smallest irregularity on the permanent support or the smallest dust or dirt particle on the permanent support, on the transfer layer or on both layers prevents adequate adhesion of the transfer layer to the permanent support, which adversely affects operation of the resist or image reproduction and color reproduction in these areas.

With resist layers, these adverse effects occur primarily during washoff when exposed areas which do not adhere properly to the support are removed, so that the etching solution or the solder material can act on areas that should actually be protected by the resist layer.

In the preparation of color reproductions, inadequate adhesion causes "noncolored" flaws, which are visible as white spots if paper is used as the image receptor. These defects are especially noticeable in continuous tone areas and large area scanning patterns.

Therefore, the object of the present invention is a transfer layer sheet comprising a temporary support and a transfer layer that does not show these disadvantages, that is, a transfer layer sheet, which avoids the adverse effects caused by surface irregularities or dust particles. This objective is achieved by a transfer layer material as defined in claim 1.

The transfer layer sheet of the invention is characterized in that the temporary support consists essentially of a compressible material. Practically all compressible materials are suitable if their compressibility is greater than 15% as measured with uniaxial loading by the following method:

A stack of $50 \times 50$ mm test samples of the compressible material with a measured total thickness of about 10 mm is placed in Universal Testing Machine made by Zwick Co., Ulm, Federal Republic of Germany, with a load capacity of 50 kN. The plunger of the testing machine is then lowered continuously at a speed of 1 mm/min and compresses the sample stack. At a pressure of 10 kN, the resulting compression of the sample stack is measured and stated as a percent of the thickness of the stack before the application of pressure.

Suitable support materials are natural or synthetic rubbers, such as styrene-butadiene, styrene-isoprene or butadiene-acrylonitrile rubber. However, open cell, closed cell or mixed open and closed cell foams, in which the foam has a closed cell skin on at least one side have been found especially satisfactory. Foams with a sandwich structure, that is, with a closed cell skin on both sides, are of special significance within the scope of the present invention. The known foam materials, including foams made from polyethylene, polypropylene, polystyrene, ABS, polyvinyl chloride, polyurethane, polyesters, and their copolymers, are candidate materials. Paper is also a suitable temporary support insofar as it has the required compressibility.

The thickness of the temporary support can be 30 to 300 $\mu$m, preferably between 30 and 90 $\mu$m. (The selection depends on end use and in the case of foam, is a function of the specific gravity of the foam.) The reason assumed for the advantageous effect of this support is that the transfer layer in contact with the permanent support can accommodate better to nonuniformities as a result of the compliability of the temporary support and can completely envelop dust particles. Consequently, good adhesion is achieved immediately adjacent to the dust particle and layer transfer can ensue. Therefore, the defect area, that is, the size of the area in which no adhesion or no layer transfer occurs, corresponds closely to the diameter of the dust particle and has practically no adverse effect on the quality of the finished image. In contrast, when conventional noncompressible supports are used, nonuniformities or dust particles are distorted by the transfer process, so that the defect area can be 10 to 20 times the diameter of the dust particle. Thus, the areas in which no adhesion or layer transfer occurs are relatively large and result in troublesome defects on the finished image.

Light sensitive transfer layers for the production of photoresist masks are known from German Patent No. 1,522,515. For the production of the masks, the resist layers on a temporary support are transferred using pressure and/or heat onto a permanent metal support and exposed imagewise. The temporary support is then removed, and the exposed areas are washed off. The resulting permanent support can then be modified in the areas uncovered through this process. If the temporary support is opaque to actinic light, that support is removed before exposure.

Transfer layers for the production of solder resist masks are known from U.S. Pat. No. 4,278,752.

Light sensitive transfer layers for the preparation of color reproductions and printing proofs are also known. This includes most importantly the positive working tonable, photopolymerizable imaging materials known from German Pat. Nos. 1,210,321 (U.S. Pat. No. 3,620,726), 1,904,058 (U.S. Pat. No. 3,620,726), 1,904,059 (U.S. Pat. No. 3,582,327) and 2,004,214. For image production, the tacky, light sensitive layer on a temporary support is transferred onto a permanent support, most commonly paper, and exposed imagewise through a color separation transparency, whereby the exposed image areas lose their tackiness. The image is then rendered visible by the application of a toner material corresponding to the color separation transparency used. This process can be repeated with color separation transparencies of other colors and using other toners. In addition, it is also known to use washoff materials for this purpose.

The production of printing proofs can thus proceed mainly in one of two ways. According to one procedure, a colored, light sensitive layer is transferred from a temporary support onto a permanent support, is exposed and the unexposed areas washed off, so that a relief image in one color results. This process can then be repeated with both other primary colors and with black if desired. Alternatively, the relief images in the three primary colors are prepared first, with an optional fourth black image, and the relief images are then transferred successively onto a receptor. Suitable materials and methods are described in German OS's Nos. 2,205,191, 2,410,287, 3,342,681, and German Pat. Nos. 1,923,989, and 2,522,656.

Light sensitive transfer layers for the production of images on layers having imagewise tacky and nontacky areas are also known. For example, German Pat. No. 1,205,117 (U.S. Pat. No. 3,060,025) discloses for this purpose layers composed of a thermoplastic binder and a pigment. German Pat. No. 2,949,462 (U.S. Pat. No. 4,275,140) discloses pigmented layers that contain 75-95% by weight of pigment and 25-5% by weight of an elastomeric binder. With this process, highly opaque images are obtained which can be used preferably for the reproduction of lettering and display materials.

The use of compressible temporary supports is especially significant with the transfer layers of German Patent Application P 3,625,014.7 (U.S. Ser. No. 066,125), the teaching of which is incorporated herein by reference. These layers are transferred in an imagewise manner and image quality is highly dependent on adhesion. These transfer layers contain at least one finely divided powder or a dissolved dye as toning material in a binder containing at least two incompatible polymers. One is a polymer phase (a), which is in the form of discrete particles, and has a minimum film forming temperature of >50° C. The second is a polymer phase (b), which comprises at least one thermoplastic and/or thermoplastic/elastomeric polymer. The minimum film forming temperature of polymer phase (b) in the case of a latex, or the glass transition temperature in the case of a dissolved polymer, is at least 10° C. lower than the minimum film forming temperature of polymer phase (a). The binder contains 55-97% by weight of polymer phase (a) and 3-45% by weight of polymer phase (b).

The light insensitive transfer layer material is suitable for image production on all light sensitive layers that can be converted imagewise into tacky and nontacky areas. These layers can contain positive as well as negative working light sensitive systems. For positive working systems, photohardenable, most particularly photopolymerizable, systems are suitable, as described in German Pat. Nos. 1,210,321 (U.S. Pat. No. 3,620,726), 1,904,058 (U.S. Pat. No. 3,620,726), 1,904,059 (U.S. Pat. No. 3,582,327) and 2,004,214. These photopolymerizable systems contain as significant components one or more addition polymerizable monomers, a binder or binder mixture and a photoinitiator or an initiator system. Negative tonable systems are similarly known and described in German Pat. Nos. 2,758,209, 3,023,247 and 3,429,615. These systems contain as light sensitive components either a light sensitive dihydropyridine compound or a light sensitive system consisting of a dihydropyridine compound and a hexaaryl-bis-imidazole compound.

Many finely divided powders suitable for image production are known from the literature, for example, in German Pat. Nos. 1,904,058 and 2,946,896. These powders involve primarily pigments, but dissolved dyes are also useful. Cited examples are inorganic and organic pigments, fluorescent materials, metal powders in pure form or combined with powdered organic or inorganic carriers, such as titanium dioxide, silicon dioxide, glass powder, carbon (carbon black or graphite), metal phthalocyanines, azo dyes, metal powder of aluminum, copper, iron, gold or silver or metal oxides and soluble organic dyes.

The cited light sensitive transfer layers and the light sensitive layer that is convertible into tacky and nontacky areas and serves as the receptor are most sensitive to ultraviolet radiation, preferably at wave lengths between 250 and 450 nm. All radiation sources that deliver an effective amount of this radiation are suitable for exposure, for example, xenon lamps, mercury vapor lamps, carbon arc lamps, lasers, fluorescent materials that emit UV light and electronic flash devices.

As especially desirable results are achieved if the transfer layers of German Patent Application P 3,625,014 are used with a compressible support in accordance with the invention, the process of image production is illustrated by an example of a color proofing procedure with these layers. The light sensitive material, for example, a laminate of a photopolymerizable layer coated on a transparent support film and a cover layer, is, after removal of the cover film, applied onto an image receptor. Depending on whether a positive or negative working system is involved, the photosensitive layer is exposed to actinic light through the transparent support using a screened positive or negative color separation transparency as the original to produce tacky and nontacky areas. The transfer layer of the transfer layer sheet is brought into surface contact with the exposed layer by lamination at 85° C. and then the temporary support is peeled off. A color image of the original is obtained. After removal of the cover sheet a second laminate of the light sensitive material is laminated onto the image, is exposed under the same conditions with a screened color separation negative or positive of a second color as the original, and is toned by lamination and repeat removal of the layer transfer material. This process is then repeated with a color separation transparency in a third color and, if desired, with a black transparency. A four color image corresponding to the original is obtained.

EXAMPLE 1

A coating formulation of the following composition is prepared for the production of transfer layer materials:

55 g of an acrylic copolymer neutralized with alkali, containing methacrylic acid and acrylonitrile and with a minimum film forming temperature (MFT) <1° C., and 48.0 g of a dispersion of a cyanine pigment based on copper phthalocyanine are mixed with stirring into 840 g of a 38% by weight latex of a copolymer of methyl methacrylate and methacrylic acid (97/3 parts by weight) with an MFT of >90° C.

The coating composition is divided into four parts and coated on the following supports so that the layer thickness after drying is 4 μm:
  (a) polyethylene terephthalate (25 μm thick)
  (b) polyethylene terephthalate (50 μm thick)
  (c) polypropylene film (50 μm thick)
  (d) foamed polypropylene film with a sandwich structure (50 μm thick)

The transfer layers thus obtained are then laminated successively at 85° C. under pressure onto a tacky, unexposed, positive tonable photopolymerizable layer, which was prepared according to the teaching of Example 1 of U.S. Pat. No. 4,356,253 after, if desired, removal of the cover sheet. The sample is laminated through two rollers. The lower roller is the drive roller and has a synthetic resin coating with a Shore A hardness of 95. The upper heated roller has a rubber coating with a Shore A hardness of 50. After lamination, the temporary support is removed. Blue, continuous toned surfaces are obtained, showing in part many white spots.

For evaluation, five samples each of 200 cm² are cut out and the white spots present counted. The result is summarized in Table 1.

TABLE 1

| Film | \multicolumn{5}{c}{Number of Spots in Sample} |
|---|---|---|---|---|---|
|   | 1 | 2 | 3 | 4 | 5 |
| a | 95 | 103 | 47 | 25 | 130 |
| b | 64 | 87 | 113 | 20 | 140 |
| c | 41 | 25 | 68 | 75 | 80 |
| d | 0 | 0 | 1 | 0 | 4 |

Thus, a drastic decrease in the number of white spots is achieved with the support in accordance with the invention.

EXAMPLE 2

A coating formulation of the following composition is prepared for the production of transfer layer materials:

64 g of a 30% by weight latex of 2-ethylhexyl acrylate, methyl methacrylate and methacrylic acid (70/28/2 parts by weight) with an average molecular weight of 10,000 and a MFT <0° C. and 18.6 of a dispersion of a finely divided cyanine pigment are added slowly with stirring to 346 g of a 32% by weight latex of a copolymer of methyl methacrylate and methylacrylic acid (98/2 parts by weight) with a MFT >95° C.

The coating composition is divided into four parts and then coated on the following supports so that the layer thickness after drying is 4 μm:
  (a) polyethylene terephthalate (25 μm thick)
  (b) polyethylene terephthalate (50 μm thick)
  (c) polypropylene film (50 μm thick)
  (d) foamed polypropylene film with a sandwich structure (50 μm thick)

Each of the resulting transfer layer materials is then laminated at 85° C. under pressure onto a tacky, unexposed, positive tonable photopolymerizable layer as in Example 1 and the temporary supports removed. Blue continuous tone surfaces are obtained, showing in part many white spots.

For evaluation, five samples each of 200 cm² area are cut out and the white spots present are counted. The result is summarized in Table 2.

TABLE 2

| Film | \multicolumn{5}{c}{Number of Spots in Sample} |
|---|---|---|---|---|---|
|   | 1 | 2 | 3 | 4 | 5 |
| a | 64 | 88 | 135 | 24 | 51 |
| b | 28 | 79 | 64 | 140 | 31 |
| c | 44 | 25 | 85 | 61 | 54 |
| d | 0 | 0 | 2 | 4 | 0 |

SUMMARY

The subject of the invention is a temporary support for transfer layers. In the transfer of light sensitive or light insensitive layers from a temporary support onto a permanent support, the smallest nonuniformities, such as, for example, dust particles, prevent locally the adhesion of the transfer layer to the permanent support, so that the reproduction of the image is adversely affected in these areas. These disadvantages can be avoided by the use of temporary supports of a compressible material. Suitable materials are those with a compressibility greater than 15%. Foams are especially preferred, particularly those that have a closed cell skin on at least one side.

We claim:

1. In a process for applying a supported transfer layer to a permanent support, comprising the steps of:
   (a) providing a transfer layer sheet comprising a temporary support, a transfer layer, and, optionally, one or more auxiliary layers,
   (b) applying the transfer layer sheet to the permanent support, with the transfer layer in surface-to-surface contact with the permanent support, and,
   (c) removing the temporary support, whereby the transfer layer is transferred to the permanent support,
the improvement wherein the temporary support consists essentially of a compressible material, which has a compressibility of at least 15%.

2. A process according to claim 1, wherein the temporary support is an open cell foam, closed cell foam, or a mixed open and closed cell foam.

3. A process according to claim 2, wherein the foam has a closed cell skin on at least one side.

4. A process according to claim 3, wherein the foam has a sandwich structure.

5. A process according to claim 4, wherein the foam is a sandwich of olefin copolymer/polyolefin foam/olefin copolymer.

6. A process according to claim 1, wherein the transfer layer contains at least one finely divided powder and/or a dissolved dye in a binder, and the binder of the transfer layer consists essentially of
   (a) about 55-97 wt. % of at least one polymer in the form of a powder having a minimum film-forming temperature of above 50° C., and,
   (b) about 3-45 wt. % of at least one thermoplastic and/or thermoplastic/elastomeric polymer, having a minimum film-forming temperature when used as a latex, or, a glass transition temperature when used as a dissolved polymer, which is at least 10° C. lower than the minimum film-forming temperature of polymer phase (a), whereby polymer phases (a) and (b) are incompatible.

7. A process according to claim 1, wherein the transfer layer is light sensitive and is transferred as a complete layer onto a permanent support before exposure.

8. A process according to claim 1, wherein the transfer layer is light sensitive and the image or partial image is transferred onto the permanent support.

* * * * *